(12) United States Patent
Solstin (10) Patent No.: US 11,444,621 B2
(45) Date of Patent: Sep. 13, 2022

(54) TOUCHLESS TRIGGER APPARATUS

(71) Applicant: Bryan B Solstin, Mill Creek, WA (US)

(72) Inventor: Bryan B Solstin, Mill Creek, WA (US)

( * ) Notice: Subject to any disclaimer, the term of this patent is extended or adjusted under 35 U.S.C. 154(b) by 321 days.

(21) Appl. No.: 16/858,663

(22) Filed: Apr. 26, 2020

(65) Prior Publication Data

US 2021/0336619 A1    Oct. 28, 2021

(51) Int. Cl.
*H03K 17/94*    (2006.01)
*H01H 13/20*    (2006.01)

(52) U.S. Cl.
CPC ........... *H03K 17/941* (2013.01); *H01H 13/20* (2013.01); *H01H 2231/052* (2013.01); *H01H 2239/022* (2013.01)

(58) Field of Classification Search
CPC .... H03K 17/941; H03K 17/968; H01H 13/20; H01H 2231/052; H01H 2239/022; H01H 59/0009; F16P 3/14; F16P 3/144; E05Y 2400/852
See application file for complete search history.

(56) References Cited

U.S. PATENT DOCUMENTS

| | | | | |
|---|---|---|---|---|
| 4,305,006 A * | 12/1981 | Walthall | ............... | H05B 47/115 250/221 |
| 5,077,467 A * | 12/1991 | Barron, Jr. | ........... | H03K 17/941 250/221 |
| 5,665,961 A * | 9/1997 | Matzka | ................... | F16P 3/144 250/221 |
| 6,107,938 A * | 8/2000 | Du | ....................... | H03K 17/941 340/12.18 |
| 7,115,856 B2 * | 10/2006 | Peng | .................... | H03K 17/941 340/567 |
| 10,320,384 B2 * | 6/2019 | Lohbihler | .............. | H05B 47/10 |

\* cited by examiner

*Primary Examiner* — Vanessa Girardi (57) ABSTRACT

A touchless trigger apparatus is touchless button, comprising a photon-gate side, a photon-gate distal side more than 1 cm (11.0 in) and less than 30 cm (11.0 in) across the photon-gate opening, to the photon-gate side. An electro-optical sensor is connected to the photon-gate side. An ASIC controller is connected to the output of the electro-optical sensor. Lastly a button face is within the opening of the photon gate. Alternatively, a touchless trigger apparatus is a touchless pushbutton, or a touchless switch. Any person or primate trained to use a button, pushbutton or switch could intuitively learn to use a touchless trigger apparatus due to its recognizable combination of elements and low-latency feedback before touching the button, the pushbutton or the switch.

20 Claims, 7 Drawing Sheets

TOUCHLESS TRIGGER APPARATUS

BACKGROUND

The touchless trigger apparatus relates to a button, pushbutton or switch without touching any physical surface. More particularly, the touchless trigger apparatus has a photon beam across a photon-gate triggered by a finger or hand.

A pushbutton is a simple mechanism to control a machine or a process. The button surface is typically flat or shaped to accommodate a human finger or a hand. The most common type of switch is an electromechanical device consisting of a movable, electrical contacts connect a circuit. When a pair of contacts touch, the open circuit closes and current flows. When the contacts are separated no current flows. Less common pushbuttons break a circuit. Other pushbuttons do not directly switch an electrical circuit but use mechanical linkages. All three pushbutton examples use a spring to return to their un-pushed state.

Capacitive multi-touch can function as pushbutton and is commonly implemented using capacitive sensing technology in mobile devices. A capacitive touchscreen typically consists of a capacitive touch sensor, application-specific integrated circuit (ASIC) controller and digital signal processor (DSP) fabricated from a complementary metal-oxide-semiconductor (CMOS) technology. A more recent alternative approach is optical touch technology, based on image sensor technology.

Buttons, pushbuttons and switches are frequently contaminated with pathogens. The physical surfaces provide a path for indirect person-to-person transmission. Pathogens include coronavirus (covid-19), noroviruses, rotavirus, poliovirus, adenovirus, influenza virus, staphylococcus aureus, and salmonella enterica. A touchless trigger apparatus can be used as a touchless button, a touchless pushbutton or touchless switch. The touchless triggers would break the indirect transmission by eliminating the need to touch the infected surface. Pathogen hotspots include, Automated Teller Machines (ATM) buttons, elevator buttons, gas pump keypads and hospital light switches.

Early adoption may include hospital elevator buttons, hospital light switches and hand buttons to open doors. As adoption broadens, touchless triggers should improve public health, improve the quality of life and translate annually into billions of U.S. dollars to an improved economy.

SUMMARY

A touchless trigger apparatus is touchless button, comprising a photon-gate side, a photon-gate distal side more than 1 cm (11.0 in) and less than 30 cm (11.0 in) across the photon-gate opening, to the photon-gate side. An electro-optical sensor is connected to the photon-gate side. An ASIC controller is connected to the output of the electro-optical sensor. A button face is within the photon gate opening.

Alternatively, a touchless trigger apparatus is a touchless pushbutton comprising a photon-gate side, a photon-gate distal side more than 1 cm (11.0 in) and less than 30 cm (11.0 in) across the photon-gate opening, to the photon-gate side. An electro-optical sensor is connected to the photon-gate side. An ASIC controller is connected to the output of the electro-optical sensor. A pushbutton is within the photon gate opening.

Alternatively, a touchless trigger apparatus is also a touchless switch comprising a photon-gate side, a photon-gate distal side more than 1 cm (11.0 in) and less than 30 cm (11.0 in) across the photon-gate opening, to the photon-gate side. An electro-optical sensor is connected to the photon-gate side. An ASIC controller is connected to the output of the electro-optical sensor. A switch is within the photon gate opening.

BRIEF DESCRIPTION OF THE FIGURES

The apparatus may be better understood by referring to the following figures. The components in the figures are not necessarily to scale, emphasis instead being placed upon illustrating the principles of the apparatus. In the figures, reference numerals designate corresponding parts throughout the different views.

DETAILED DESCRIPTION

Definitions:

As used herein, the term "touchless trigger" has reference to a "touchless button" (100), a "touchless pushbutton" (200) and a "touchless switch" (300)

As used herein, the term "touchless trigger event" provides for the electro-optical sensor to signal a response to a photon perturbation in the photon-gate opening due to the movement of a finger, hand or handy object.

As used herein, the term "touchless button" (100) has reference to a photon-gate side, a photon-gate distal-side, an electro-optical sensor and a button face.

As used herein, the term "touchless pushbutton" (200) has reference to a photon-gate side, a photon-gate distal-side, an electro-optical sensor and a pushbutton.

As used herein, the term "touchless switch" (300) has reference to a photon-gate side, a photon-gate distal-side and an electro-optical sensor.

As used herein, the term "active light" (300) has reference an electro-light source being added to a photon-gate side, a photon-gate distal-side. Examples include a laser, LED and incandescent light bulb. The active light is added to the side of the photon-gate side with the electro-optical sensor. The active light can be added to the same side of the photon-gate, where the electro-optical light is located but a reflector, or reflection, is needed on the photon-gate distal side.

As used herein, the term "electro-optical sensor" (1) provides for an "electro-optical sensor" to convert incoming photons into electronic output and the output providing for a change in resistance, voltage or current. A photodiode is commercially available and converts photons into current. A change in resistance may require an additional power source. A photoresistor provides a change in resistance and is often used on streetlamps and does not use an additional power source but has a latency issue when used with a touchless button.

As used herein, the term "photon-gate" provides for an opening and is comprised of a photon-gate side (2) and a photon-gate distal side (3).

As used herein, the term "photon-gate side" (2) provides for a recognizable and utilitarian opening to a button, pushbutton or switch. The photon-gate side provides for a photon to travel between the photon-gate side and the photon-gate distal side. Between the two sides of the photon-gate, a photon beam points across the photon-gate's opening, creating a trigger, or more particularly, a touchless trigger. The photon-gate is a trigger when the photon beam is broken. Any person or primate trained to use a button, pushbutton or switch could intuitively learn to use a touchless trigger due to its recognizable combination of elements and low-latency feedback before touching the button, the pushbutton or the switch.

As used herein, the term "photon-gate distal-side" (3) provides for a recognizable and utilitarian opening to a button, pushbutton or switch. The photon-gate side provides for a photon to travel between the photon-gate side and the photon-gate distal-side. Between the two sides of the photon-gate, a photon beam points across the photon-gate's opening, creating a photon beam, or more particularly, a touchless trigger. The photon-gate is a trigger when the photon beam is broken. Any person or primate trained to use a button, pushbutton or switch could intuitively learn to use a touchless trigger due to its recognizable combination of elements and low-latency feedback before touching the button, the pushbutton or the switch.

As used herein, the term "photon beam" (4) provides for the "touchless trigger event" at a location in the photon-gate's opening.

As used herein, the term "upper photon beam" (5) provides for the "touchless trigger event" at a location across the photon-gate's opening and located above the photon beam (4).

As used herein, the term "light cover" (7) provides for protective cover for a photon source.

As used herein, the term "signal wire" (11) provides for the electro-optical sensor output of the electro-optical sensor to exit the photon-gate.

As used herein, the term "power wire" (12) provides for power to enter the photon-gate and power a photon emitting device.

As used herein, the term "button face" (15) provides for a visual image for the touchless operator.

As used herein, the term application-specific integrated circuit "ASIC" controller (31) provides for an integrated circuit (IC) customized for a particular use, rather than general-purpose use. A central processing unit (CPU) is an example of a general-purpose integrated circuit. The ASIC provides for a touchless trigger event: on-status and off-status stored in a non-transitory storage medium. More specifically, the asic controller recording the touchless trigger event onto non-transitory storage.

As used herein, the term "digital signal processor" (DSP) (32) provides for measure and filter of the electro-optical sensor's analog signals. DSPs are commercially off the shelf available but can be written into the ASIC. Most general-purpose microprocessors and operating systems can execute DSP algorithms successfully but requires more power.

As used herein, the term "mems button" (microelectromechanical system) button (35) provides for a capacitive MEMS switch. A moving plate or sensing element changes the capacitance.

As used herein, the term "Serial Bus Socket" (131) provides for communication and power supply to a touchless trigger.

As used herein, the term "DSP-ASIC connection" (132) provides for output from the DSP to the ASIC.

As used herein, the term "MEMS button-ASIC connection" (135) provides for output from the MEMS button to the ASIC.

As used herein, the term "socket" (136) provides for a connection to enable the installation of a pushbutton with the touchless pushbutton assembly. The socket also connects the switch body (338).

As used herein, the term "pushbutton" (215) provides for a flat or shaped surface to accommodate a human finger or a hand. Pushbutton shaped surface includes flush, projecting, mushroom, recessed and curved. The pushbutton switch is an electromechanical device consisting of a movable, electrical contacts connecting a circuit. When a pair of contacts touch, the open circuit closes and current flows. When the contacts are separated no current flows. A spring returns the pushbutton to an unpushed state.

As used herein, the term "nut" (216) is a nut for securing the pushbutton and tightened during assembly or installation.

As used herein, the term "solenoid" (336) provides for a transducer device that converts energy into linear motion.

As used herein, the term "link" (337) provides for a mechanical linkage between the solenoid and the switch.

As used herein, the term "switch body" (338) provides a cover for the switch.

As used herein, the term "upper electro-optical sensor" (341) provides for an electro-optical sensor, above the switch, to convert incoming photons into electronic output and the output providing for a change in resistance, voltage or current. A photodiode is commercially available and converts photons into current. A change in resistance may require an additional power source. A photoresistor provides a change in resistance and is often used on streetlamps and does not use an additional power source but has a latency issue when used with a touchless button.

As used herein, the term "upper light cover" (342) provides for a protective cover for a photon source above the switch.

As used herein, the term "laser" (401) provides for a semiconductor device directly converting electrical energy into light, and the resulting photon beam crosses the photon-gate. Laser diodes are the most common type of lasers produced. Driven by voltage, the doped p-n-transition allows for recombination of an electron with a hole. Due to the drop of the electron from a higher energy level to a lower one, radiation, in the form of an emitted photon is generated. This is spontaneous emission. Stimulated emission can be produced when the process is continued and further generate light with the same phase, coherence and wavelength. The choice of the semiconductor material determines the wavelength of the emitted beam, which in today's laser diodes range from infra-red to the UV spectrum.

As used herein, the "light emitting diode" (402) provides for a semiconductor light source that emits light when current flows through it. Electrons in the semiconductor recombine with electron holes, releasing energy in the form of photons. The color of the light (corresponding to the energy of the photons) is determined by the energy required for electrons to cross the band gap of the semiconductor. White light is obtained by using multiple semiconductors or a layer of light-emitting phosphor on the semiconductor device.

As used herein, the "incandescent light bulb" (403) provides an electric light with a wire filament heated until it glows. The filament is enclosed in a bulb to protect the filament from oxidation.

Figure 1A:
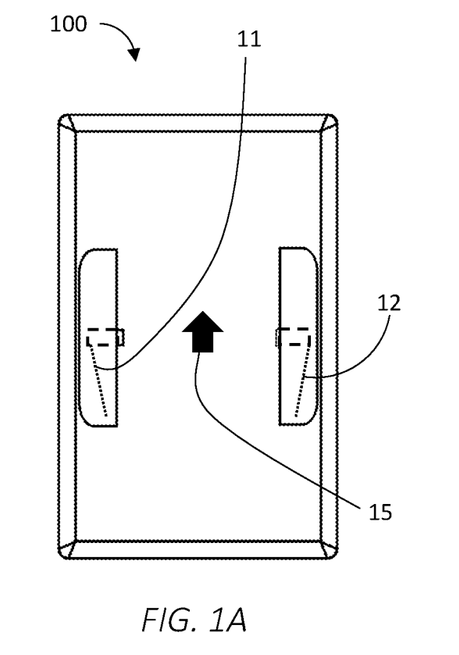
FIG. 1A represents a front view of a touchless button.

Turning to FIG. 1A, a front view of a touchless button apparatus (100). The photon-gate provides an advantageous touchless trigger. Regardless, if the photon beam is across the photon-gate in one direction or reflects the beam back across the photon-gate, a photon-gate is advantageous by providing a recognizable touchless trigger to a touchless operator and enhances a photon perturbation detection to the elector-optical sensor, even without the necessity of an active light.

Best practice would add an active light to the photon-gate; such as, a laser, LED or incandescent light. A photon-gate, active light and as well an ASIC controller reduces latency. An active light can also assist seeing a touchless trigger in a dark room. A touchless trigger and mechanical trigger in combination, is not confusing, but rather, is a teaching combination. If both are toggled in less than one second, it would be counted as one toggle. An active light can also provide feedback by changing the lumens when the touchless trigger event toggles.

Any person or primate trained to use a button, pushbutton or switch could intuitively learn to use a touchless trigger due to its recognizable elements and reduced latency feedback before touching button, the pushbutton or the switch. A touchless trigger event toggles to an on-status or off-status without a button, pushbutton or switch. Best practice, however, combines the touchless trigger with a button, a pushbutton, or switch because the combination of elements serves as a teaching combination for the new touchless operator. With low-latency feedback, afforded by the photon-gate and ASIC controller, teaches the new touchless operator to quickly learn; that touching the button, pushbutton, or switch is merely an option, not a necessity. In other words, a person or primate trained to use a button, pushbutton or switch would intuitively learn how to use a touchless trigger.

Figure 1B:
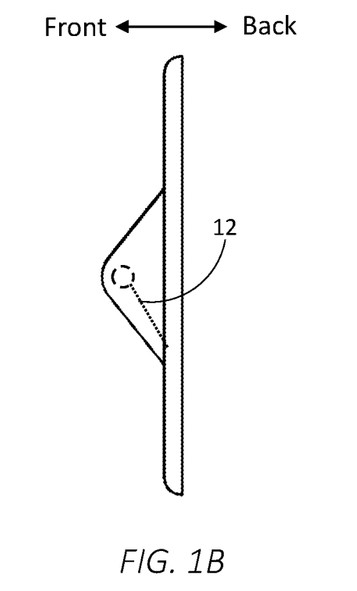
FIG. 1B represents a side view of a touchless button.
Figure 1C:
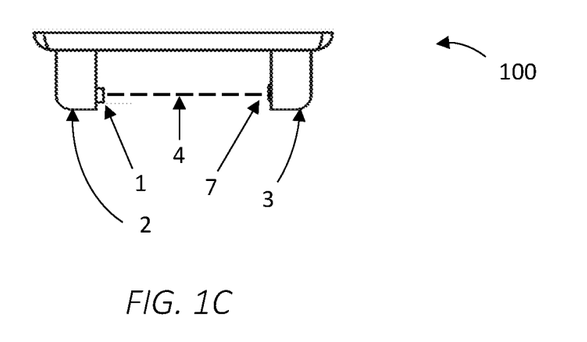
FIG. 1C represents a top view of a touchless button.

Again, looking at FIG. 1C, a top view of a touchless button apparatus (100). a photon-gate side (2) provides one side of the photon-gate opening. The photon-gate distal side (3) is more than 1 cm (11.0 in) and less than 30 cm (11.0 in), across the photon-gate opening. An electro-optical sensor (1) is connected to the photon-gate side.

A light cover (7) is connected to the photon-gate distal side (3). Light coming from or reflecting from the light cover to the electro-optical sensor creates a photon beam (4). A finger, hand or handy object breaking the beam will cause a touchless trigger event, toggling the on-status or off-status and the ASIC (31) provides for a touchless trigger event: on-status and off-status stored in a non-transitory storage medium.

Turning to FIG. 1A, a front view of the touchless button apparatus (100), a button face (15) is in the photon-gate opening, between the photon-gate side and the photon-gate distal-side. The photon beam (4) is in front of the button face. A signal wire (11) provides for the electro-optical sensor output of the electro-optical sensor to exit the photon-gate. On the photon-gate distal side, a power wire" (12) provides for power to enter the photon-gate and power an active light. Turning to FIG. 1B, a side view of the touchless button apparatus, and a side view of the power wire (12). FIG. 1B, the side view, defines the front and back of the touchless button apparatus.

Figure 1D:
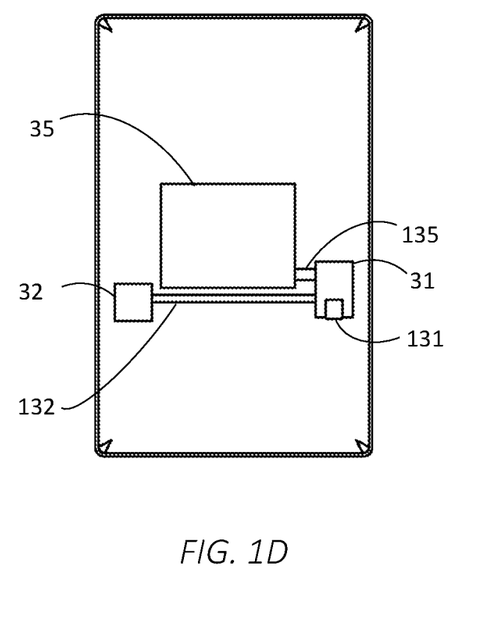
FIG. 1D represents a back view of a touchless button.

Turning to FIG. 1D, a back view represents application-specific integrated circuit" (ASIC) controller (31) provides for an integrated circuit (IC) customized for a particular use, rather than intended for general-purpose use. A CPU is an example of a general use integrated circuit. The ASIC (31) provides for a touchless trigger event: on-status and off-status stored in a non-transitory storage medium. The ASIC receives output from the electro-optical sensor.

In FIG. 1D, the back view of the touchless button apparatus (100), a digital signal processor" (DSP) (32) provides for measure and filter of the electro-optical sensor's analog signals. DSPs are commercially off the shelf available but can be written into the ASIC. When added to the configuration, the DSP is between the electro-optical sensor and the ASIC.

A mems button" (microelectromechanical system) button (35) provides for a capacitive MEMS switch. A moving plate or sensing element changes the capacitance and used to toggle the button face with the ASIC.

Continuing with FIG. 1D, the back view of the touchless button, a Serial Bus Socket (131) is connected to the ASIC and provides for input to the touchless trigger; which includes the touchless button (100), a touchless pushbutton (200) and a touchless switch (300). FIG. 1D represents a connection between the DSP and ASIC a DSP-ASIC connection (132) provides for output from the DSP to the ASIC. In FIG. 1D, and following back views, the DSP-ASIC connection is represented as a ribbon connection. Continuing with the FIG. 1D back view, a MEMS button-ASIC connection (135) provides for output from the MEMS button to the ASIC.

Figure 2A:
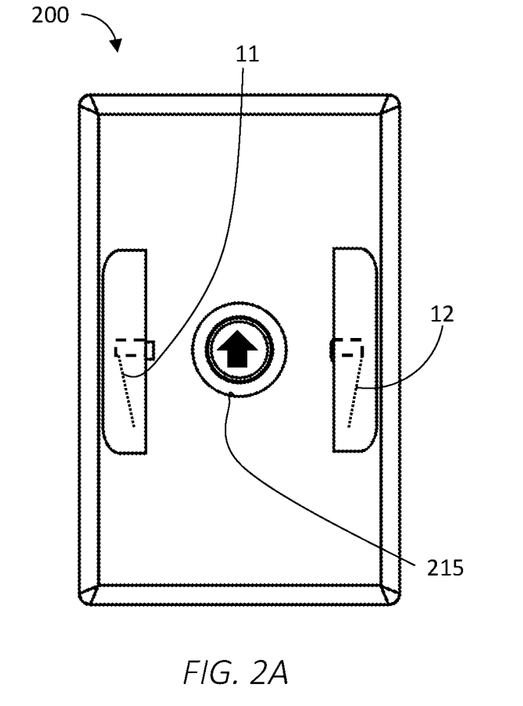
FIG. 2A represents a front view of a touchless pushbutton.
Figure 2B:
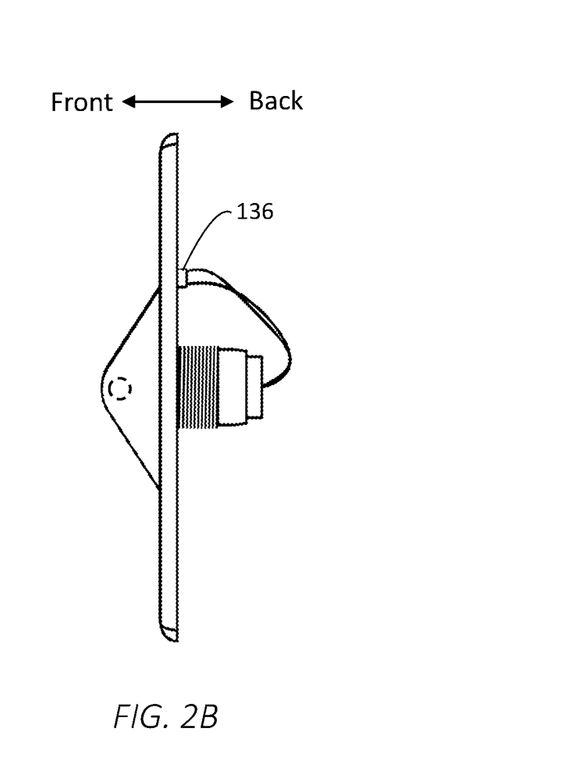
FIG. 2B represents a side view of a touchless pushbutton.
Figure 2C:
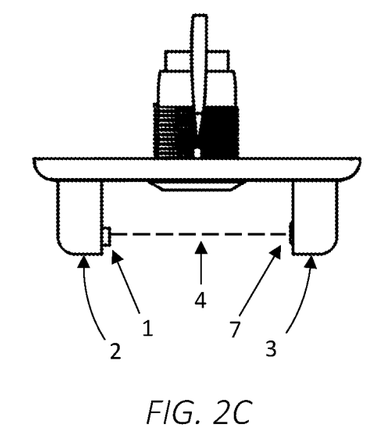
FIG. 2C represents a top view of a touchless pushbutton.
Figure 2D:
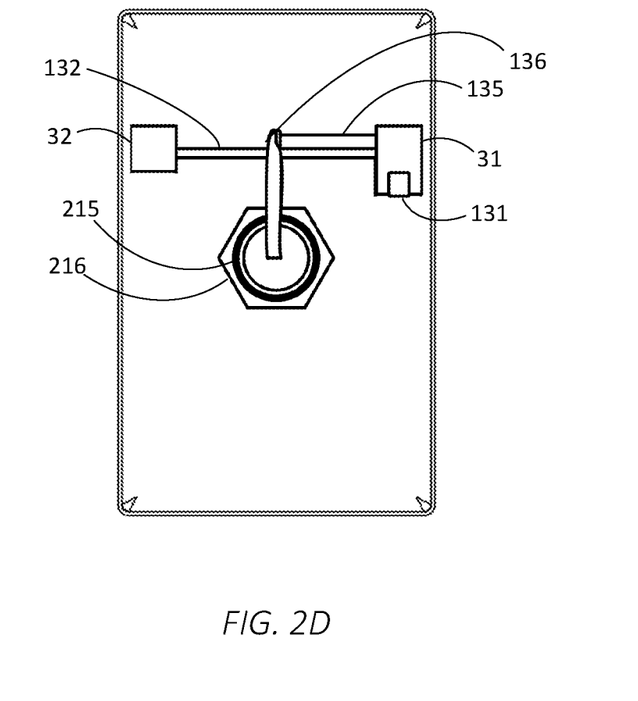
FIG. 2D represents a back view of a touchless pushbutton.

Turning to FIG. 2C, a top view of the touchless pushbutton apparatus (200) is represented. The elements in FIG. 1A, FIG. 1B, FIG. 1C and FIG. 1D are the same as FIG. 2A, FIG. 2B, FIG. 2C and FIG. 2D have the same corresponding views and same elements, except in FIG. 1A, button face (15) and FIG. 1D mems button (35) are replaced with a FIG. 2A, pushbutton (215). Turning to FIG. 2D, the back view shows a nut (216) added for the assembly of the touchless pushbutton. A socket (136) provides for a connection for the installation of a pushbutton with the touchless pushbutton apparatus (200) assembly. A permanent connection without a socket would cause a problem for getting the nut onto the pushbutton during installation and during a pushbutton replacement.

Figure 3A:
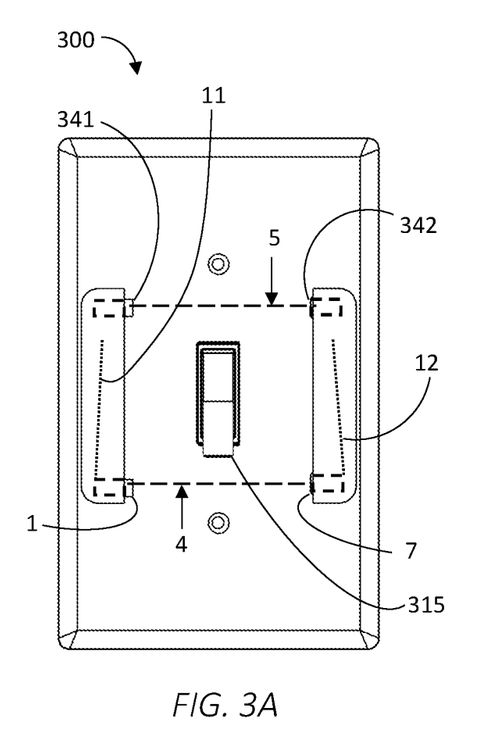
FIG. 3A represents a front view of a touchless switch.
Figure 3B:
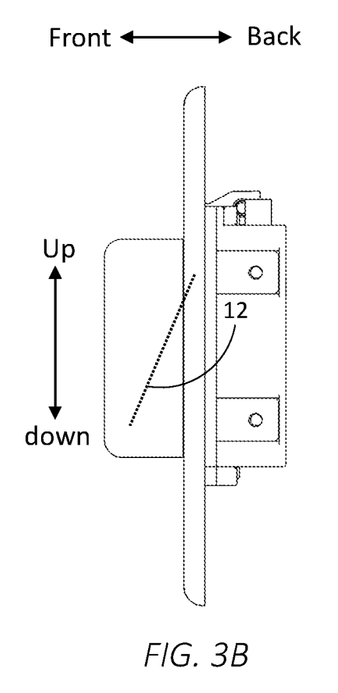
FIG. 3B represents a side view of a touchless switch.
Figure 3C:
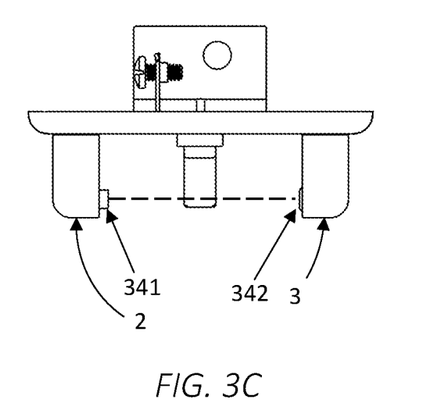
FIG. 3C represents a top view of a touchless switch.

Turning to FIG. 3C, a front view of a touchless switch apparatus (300) replaces a button face and pushbutton with a switch. Also, in contrast to the touchless button apparatus and touchless pushbutton apparatus, the touchless switch apparatus adds additional elements. FIG. 3B, the side view, defines the front and back of the touchless switch apparatus.

Starting at the top of the drawing, FIG. 3C representing a top view of the touchless switch apparatus (300). FIG. 3A represent a front view of the touchless switch apparatus (300). FIG. 2B, the side view, defines the front and back of the touchless switch apparatus.

By looking at the front view and FIG. 3C top view, it is clear the common elements: electro-optical sensor (1), light cover (7) and photon beam (4) are below the switch (315). This physical relationship ensures the touchless operator breaks the photon beam triggers the touchless trigger event before touching the switch. Likewise, the new elements in the touchless switch apparatus include, but not limited to: an upper photon beam (5) providing for a "touchless trigger event" at a location across the photon-gate's opening and located above the photon beam (4), an upper electro-optical sensor (341) provides for an electro-optical sensor above the switch, and an upper light cover (342) providing for a protective cover for a photon source above the switch.

Figures 3D, 3E:
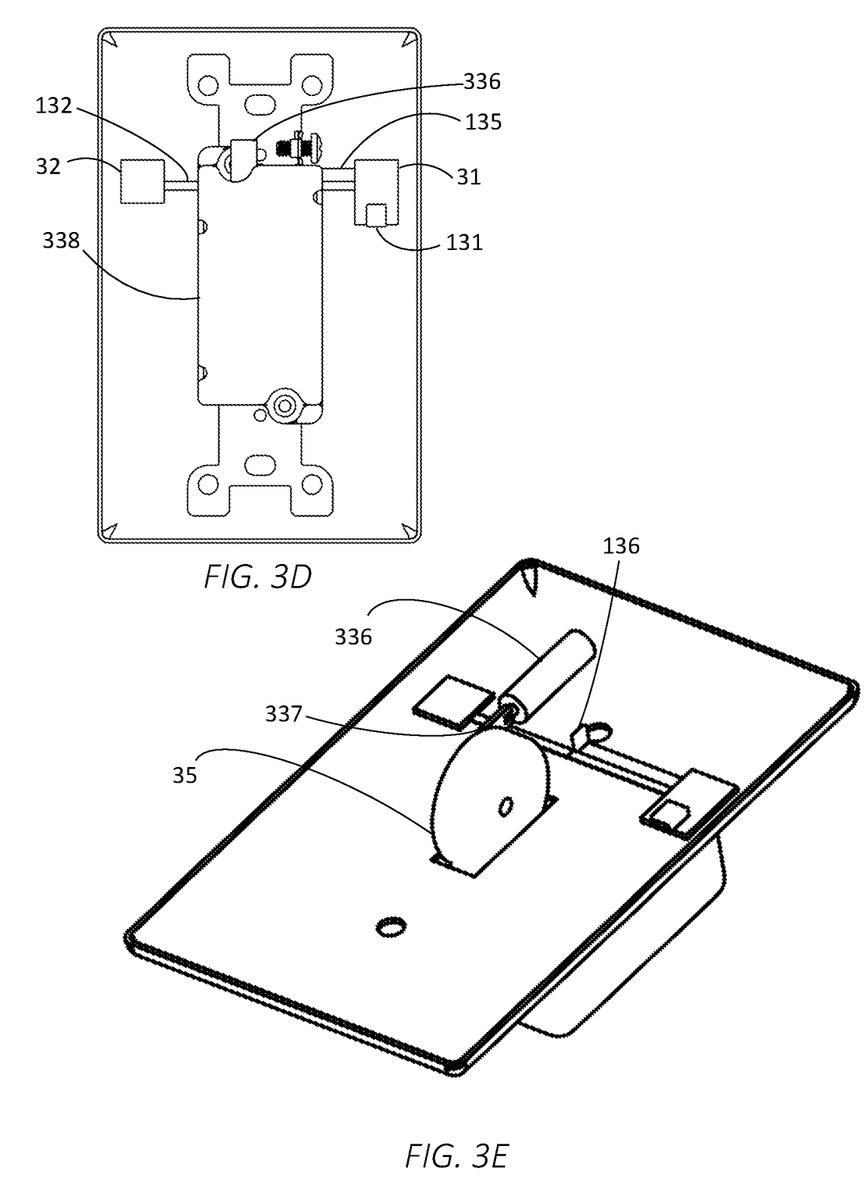
FIG. 3D represents a back view of a touchless switch.
FIG. 3E represents an isometric view of a touchless switch.

Additional new elements in touchless switch apparatus (300), in contrast to the touchless button apparatus and touchless pushbutton apparatus, are represented in FIG. 3D a back view and FIG. 3E an isometric view of the touchless switch apparatus. Depending on the experience of the touchless operator, the touchless operate may intend to toggle the switch or toggle the photon beam or upper photon beam. The less experiences touchless operator may intend to the toggle the switch. In so doing, the touchless operator will encounter the photon beam (4) or upper photon beam (5). In either case, the touchless trigger event will power the solenoid (336) represented in FIG. 3D and FIG. 3E. The solenoid provides for a transducer device that converts energy into linear motion and with a link (337) provides for a mechanical linkage between the solenoid and the switch (35). With low-latency, the switch toggles.

From a touchless operator's point of view, the experience is similar to the pedal-assist bicycle. When the bicyclist pedals, putting weight on the pedal, the electric motor assists, and the bicycle accelerates faster than without an electric motor.

Likewise, a touchless operator's point of view will be similar. The touchless operator will feel a switch assist, just like a bicyclist feels a pedal assist. The next logical step, for the touchless operator, is to toggle the photon beam without touching the switch (35) and EUREKA, the low-latency light turns on and the touchless operator learns it not necessary to touch the switch to operate the touchless switch apparatus. So, the photon beam is located below the switch (35), and the upper photon beam is located above the switch (35).

FIG. 3D represents a back view of a touchless switch. A switch body (338) provides a cover for the switch and represents another new element when compared to the touchless button apparatus and the touchless pushbutton apparatus. The switch body pushes onto the socket (136), connecting the switch to the application-specific integrated circuit (ASIC) controller (31).

Turning to the next figure. FIG. 3E represents an isometric view of a touchless switch. Without the switch body, the solenoid (336) is more visible and has a link (337) to the switch (35).

Figure 4A:
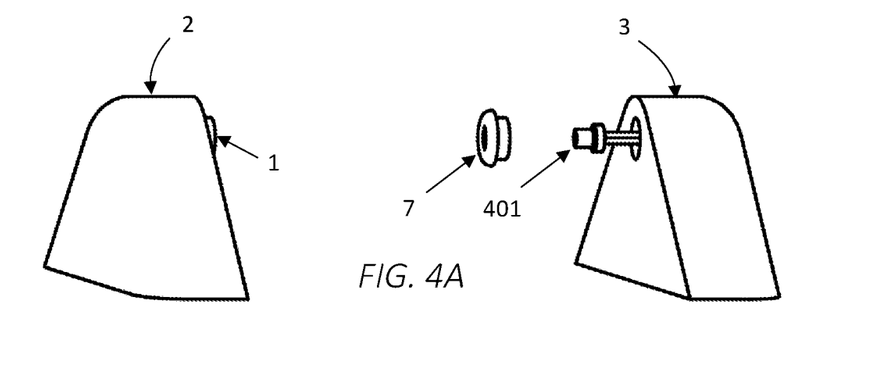
FIG. 4A represents an isometric view of a light cover and laser.
Figure 4B:
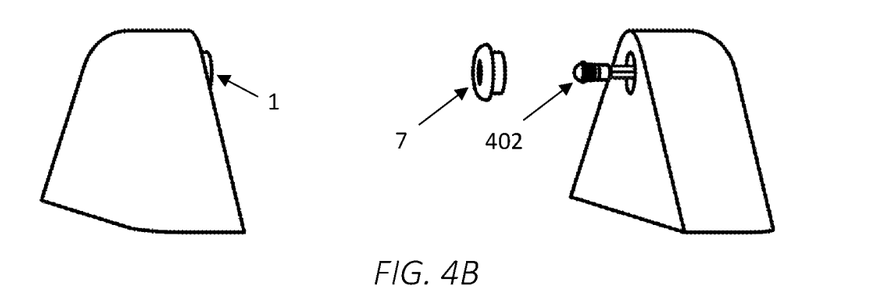
FIG. 4B represents an isometric view of a light cover and light emitting diode.
Figure 4C:
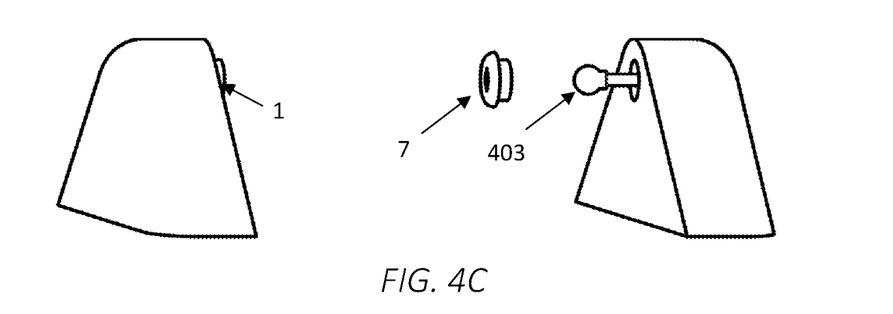
FIG. 4C represents an isometric view of a light cover and an incandescent light bulb.

Turning to FIG. 4A, FIG. 4B and FIG. 4C. Each has an isometric view of the photon gate. Each figure: FIG. 4A, FIG. 4B and FIG. 4C, has an electro-optical sensor (1). Each has an "exploded" light cover (7). The light cover could also be a lens and share photons with the photon-gate opening. This should be helpful for finding a switch in the middle of the night.

FIG. 4A has a "exploded" laser (401). Laser diodes are commercially available, "off the shelf," low cost, reliable and can provide visible and invisible photons. This combined ability would be convenient for a low-visible photon frequency for the photon beam to the electro-optical sensor and a second high-visible poton frequency for a touchless trigger event: on-status and directing the light the photon gate's opening. The light could be designed to act as a dual lens. This combination would be convenient for touchless button and would eliminate the need to have an on-status light in the touchless pushbutton. With a switch, on-status and off-status is evident without a second light or change in lumens. The laser is installed into the photon gate.

FIG. 4B has an exploded "light emitting diode" (LED) (402) and provides for a semiconductor light source that emits light when current flows through it. Electrons in the semiconductor recombine with electron holes, releasing energy in the form of photons. The color of the light (corresponding to the energy of the photons) is determined by the energy required for electrons to cross the band gap of the semiconductor. White light is obtained by using multiple semiconductors or a layer of light-emitting phosphor on the semiconductor device. The light emitting diode is installed into the photon gate.

FIG. 4C has an exploded "incandescent light bulb" (403) and provides an electric light with a wire filament heated until it glows. The filament is enclosed in a bulb to protect the filament from oxidation. The incandescent light bulb is installed into the photon gate. Compared to a laser or light emitting diode, the incandescent light bulb is not as reliable. Replacement should be a design consideration.

What is claimed is:

1. A touchless button apparatus, comprising:
   a photon-gate side;
   a photon-gate distal side more than 1 cm (11.0 in) and less than 30 cm (11.0 in), across the photon-gate opening, to the photon-gate side;
   an electro-optical sensor connected to the photon-gate side;
   a controller connected to the output of the electro-optical sensor; and
   a button face between the photon-gate side and the photon-gate distal-side.

2. The touchless button apparatus of claim 1; further comprising of:
   a digital signal processor connected between the electro-optical sensor and the asic controller.

3. The touchless button apparatus of claim 1; further comprising of:
   a light cover connected to the photon-gate distal-side;
   a photon beam between the light cover and the electro-optical sensor is more than 1 cm (11.0 in) less than 30 cm (11.0 in); and
   the photon beam is in front of the button face.

4. The touchless button apparatus of claim 1; further comprising of:
   a laser connected to the photon-gate distal-side;
   a photon beam between the laser and the electro-optical sensor is more than 1 cm (11.0 in) less than 30 cm (11.0 in); and
   the photon beam is in front of the button face.

5. The touchless button apparatus of claim 1; further comprising of:
   a light emitting diode connected to the photon-gate distal-side;
   a photon beam between the light emitting diode and the electro-optical sensor is more than 1 cm (11.0 in) less than 30 cm (11.0 in); and
   the photon beam is in front of the button face.

6. The touchless button apparatus of claim 1; further comprising of:
   an incandescent light bulb connected to the photon-gate distal-side;
   a photon beam between the incandescent light bulb and the electro-optical sensor is more than 1 cm (11.0 in) less than 30 cm (11.0 in); and
   the photon beam is in front of the button face.

7. A touchless pushbutton apparatus, comprising:
   a photon-gate side;

a photon-gate distal side more than 1 cm (11.0 in) and less than 30 cm (11.0 in), across the photon-gate opening, to the photon-gate side;
an electro-optical sensor connected to the photon-gate side;
a controller connected to the output of the electro-optical sensor; and
a pushbutton face between the photon-gate side and the photon-gate distal-side.

8. The touchless pushbutton apparatus of claim 7; further comprising of:
a digital signal processor connected between the electro-optical sensor and the asic controller.

9. The touchless pushbutton apparatus of claim 7; further comprising of:
a light cover connected to the photon-gate distal-side;
a photon beam between the light cover and the electro-optical sensor is more than 1 cm (11.0 in) less than 30 cm (11.0 in); and
the photon beam is in front of the pushbutton face.

10. The touchless pushbutton apparatus of claim 7; further comprising of:
a laser connected to the photon-gate distal-side;
a photon beam between the laser and the electro-optical sensor is more than 1 cm (11.0 in) less than 30 cm (11.0 in); and
the photon beam is in front of the pushbutton face.

11. The touchless pushbutton apparatus of claim 7; further comprising of:
a light emitting diode connected to the photon-gate distal-side;
a photon beam between the light emitting diode and the electro-optical sensor is more than 1 cm (11.0 in) less than 30 cm (11.0 in); and
the photon beam is in front of the pushbutton face.

12. The touchless pushbutton apparatus of claim 7; further comprising of:
an incandescent light bulb connected to the photon-gate distal-side;
a photon beam between the incandescent light bulb and the electro-optical sensor is more than 1 cm (11.0 in) less than 30 cm (11.0 in);
the photon beam is in front of the pushbutton face; and
the incandescent light bulb and the electro-optical sensor clearance is more than 1 cm (11.0 in) less than 30 cm (11.0 in).

13. A touchless switch apparatus, comprising:
a photon-gate side;
a photon-gate distal side more than 1 cm (11.0 in) and less than 30 cm (11.0 in), across the photon-gate opening, to the photon-gate side;
an electro-optical sensor connected to the photon-gate side;
a controller connected to the output of the electro-optical sensor; and
a switch between the photon-gate side and the photon-gate distal-side.

14. The touchless switch apparatus of claim 13; further comprising of:
a digital signal processor connected between the electro-optical sensor and the asic controller.

15. The touchless switch apparatus of claim 13; further comprising of:
a light cover connected to the photon-gate distal-side;
a photon beam between the light cover and the electro-optical sensor is more than 1 cm (11.0 in) less than 30 cm (11.0 in); and
the photon beam is below the switch.

16. The touchless switch apparatus of claim 13; further comprising of:
a laser connected to the photon-gate distal-side;
a photon beam between the laser and the electro-optical sensor is more than 1 cm (11.0 in) less than 30 cm (11.0 in); and
the photon beam is below the switch.

17. The touchless switch apparatus of claim 13; further comprising of:
a light emitting diode connected to the photon-gate distal-side;
a photon beam between the light emitting diode and the electro-optical sensor is more than 1 cm (11.0 in) less than 30 cm (11.0 in); and
the photon beam is below the switch.

18. The touchless switch apparatus of claim 13; further comprising of:
an incandescent light bulb connected to the photon-gate distal-side;
a photon beam between the incandescent light bulb and the electro-optical sensor is more than 1 cm (11.0 in) less than 30 cm (11.0 in); and
the photon beam is below the switch.

19. The touchless switch apparatus of claim 13; further comprising of:
a link connected to the switch; and
a solenoid connected to the link.

20. The touchless switch apparatus of claim 13; further comprising of:
an upper light cover connected to the photon-gate distal-side;
an upper electro-optical sensor connected to the photon-gate side;
an upper photon beam between the upper light cover and the upper electro-optical sensor is more than 1 cm (11.0 in) less than 30 cm (11.0 in); and
the upper photon beam is above the switch.

* * * * *